(12) United States Patent
Then et al.

(10) Patent No.: US 10,850,977 B2
(45) Date of Patent: Dec. 1, 2020

(54) GROUP III-N MEMS STRUCTURES ON A GROUP IV SUBSTRATE

(71) Applicant: INTEL CORPORATION, Santa Clara, CA (US)

(72) Inventors: Han Wui Then, Portland, OR (US); Sansaptak Dasgupta, Hillsboro, OR (US); Sanaz K. Gardner, Portland, OR (US); Ravi Pillarisetty, Portland, OR (US); Marko Radosavljevic, Beaverton, OR (US); Seung Hoon Sung, Portland, OR (US); Robert S. Chau, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/576,510

(22) PCT Filed: Jun. 26, 2015

(86) PCT No.: PCT/US2015/037989
§ 371 (c)(1),
(2) Date: Nov. 22, 2017

(87) PCT Pub. No.: WO2016/209264
PCT Pub. Date: Dec. 29, 2016

(65) Prior Publication Data
US 2018/0170747 A1   Jun. 21, 2018

(51) Int. Cl.
*H01L 41/09*    (2006.01)
*B81C 1/00*    (2006.01)
(Continued)

(52) U.S. Cl.
CPC ........ *B81C 1/00246* (2013.01); *B81B 3/0021* (2013.01); *B81B 7/02* (2013.01);
(Continued)

(58) Field of Classification Search
CPC .................................................... H01L 41/094
See application file for complete search history.

(56) References Cited

U.S. PATENT DOCUMENTS 3,805,601 A    4/1974 Jeffers
2002/0070841 A1    6/2002 Doppalapudi et al.
(Continued)

FOREIGN PATENT DOCUMENTS

WO    2016209264 A1    12/2016

OTHER PUBLICATIONS

International Search Report and Written Opinion received for PCT/US2015/037989, dated Mar. 14, 2016, 13 pages.
(Continued)

*Primary Examiner* — Lex H Malsawma
*Assistant Examiner* — Geoffrey H Ida
(74) *Attorney, Agent, or Firm* — Finch & Maloney PLLC

(57) ABSTRACT

Techniques are disclosed for forming group III material-nitride (III-N) microelectromechanical systems (MEMS) structures on a group IV substrate, such as a silicon, silicon germanium, or germanium substrate. In some cases, the techniques include forming a III-N layer on the substrate and optionally on shallow trench isolation (STI) material, and then releasing the III-N layer by etching to form a free portion of the III-N layer suspended over the substrate. The techniques may include, for example, using a wet etch process that selectively etches the substrate and/or STI material, but does not etch the III-N material (or etches the III-N material at a substantially slower rate). Piezoresistive elements can be formed on the III-N layer to, for example, detect vibrations or deflection in the free/suspended portion of the III-N layer. Accordingly, MEMS sensors can be formed using the techniques, such as accelerometers, gyroscopes, and pressure sensors, for example.

20 Claims, 10 Drawing Sheets

(51) Int. Cl.
   *B81B 3/00* (2006.01)
   *B81B 7/02* (2006.01)
   *G01L 1/18* (2006.01)
(52) U.S. Cl.
   CPC .... *H01L 41/094* (2013.01); *B81B 2201/0235* (2013.01); *B81B 2201/0242* (2013.01); *B81C 2203/0714* (2013.01); *G01L 1/18* (2013.01)

(56) References Cited

U.S. PATENT DOCUMENTS

| 2003/0119220 | A1* | 6/2003 | Mlcak | B81B 3/0089 438/52 |
| 2006/0098059 | A1* | 5/2006 | Ohguro | B81B 3/0018 347/72 |
| 2007/0176211 | A1 | 8/2007 | Kunze et al. | |
| 2010/0270892 | A1* | 10/2010 | Ahn | H01L 41/094 310/368 |
| 2011/0080069 | A1 | 4/2011 | Cueff et al. | |

OTHER PUBLICATIONS

International Preliminary Report on Patentability received for PCT/US2015/037989, dated Jan. 4, 2018, 10 pages.

Zimmermann, et al., "Piezoelectric GaN Sensor Structures," IEEE Electronic Device Letters, vol. 27, No. 5, May 2006. pp. 309-312.

Extended European Search Report received for EP application No. 15896550.9, dated Feb. 12, 2019. 8 pages.

Talukdar, et al., "Static and Dynamic Responses of GaN Piezoresistive Microcantilever with Embedded AlGaN/GaN HFET for Sensing Applications," IEEE, 2013. 4 pages.

* cited by examiner

GROUP III-N MEMS STRUCTURES ON A GROUP IV SUBSTRATE

BACKGROUND

Microelectromechanical systems (MEMS) relates to the technology of very small devices, such as devices made up of components on the order of 1 micron (or less) to 100 microns in size. Likewise, MEMS devices can vary from relatively simple structures having no moving elements to extremely complex systems with multiple moving elements under the control of, for example, integrated microelectronics. Typically, MEMS devices have at least one element having some sort of mechanical functionality, whether or not the element can move. MEMS devices are considered to be die-level components of first-level packaging, and include pressure sensors, accelerometers, gyroscopes, microphones, digital mirror displays, microfluidic devices, etc. MEMS sensors and actuators, which may be defined as transducers, are devices that convert energy in one form to another. In the context of MEMS sensors, the device typically converts a measured mechanical signal into an electrical signal. MEMS-based sensors (e.g., accelerometers, gyroscopes, pressure sensors, etc.) are used in a wide range of applications, such as in the field of mobile electronics, automotive electronics, medical equipment, wireless devices, inertial navigation systems, computer peripherals (such as inkjet cartridges) user interfaces, and, generally, for detecting displacements in a three-dimensional space.

BRIEF DESCRIPTION OF THE DRAWINGS

FIGS. 5 and 7 show top elevation views of integrated circuit structures.

DETAILED DESCRIPTION

Figure 1:
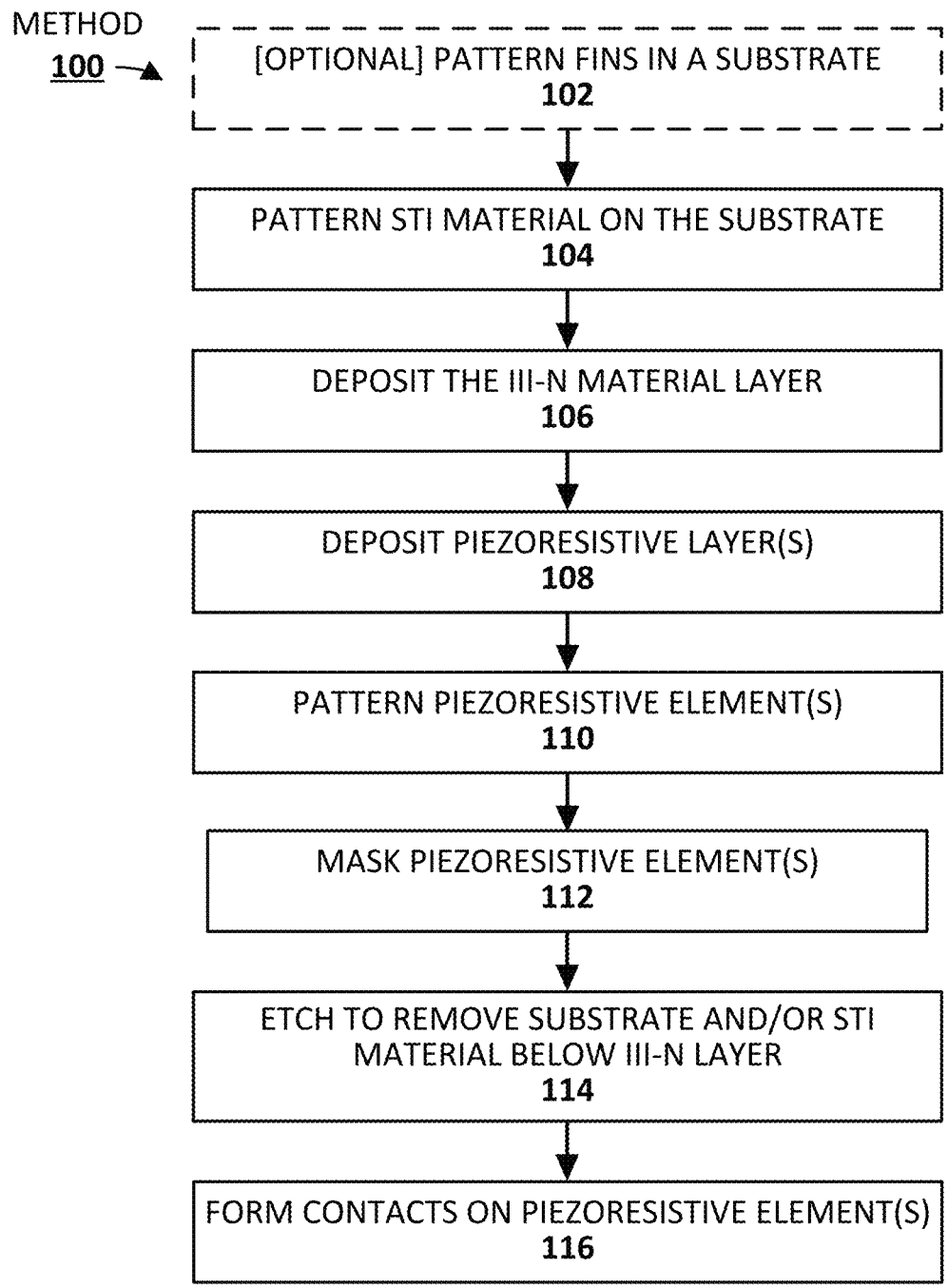
FIG. 1 illustrates a method of forming an integrated circuit, in accordance with various embodiments of the present disclosure.

Techniques are disclosed for forming group III material-nitride (III-N) microelectromechanical systems (MEMS) structures on a group IV substrate, such as a silicon, silicon germanium, or germanium substrate. The techniques include forming the III-N layer on the substrate and optionally on shallow trench isolation (STI) material, and then releasing the III-N layer by etching to form a free portion of the III-N layer suspended over the substrate, according to an embodiment. In some cases, a wet etch process is used that selectively etches the substrate and/or STI material, but does not etch the III-N material (or etches the III-N material at a substantially slower rate). Piezoresistive elements can be formed on the III-N layer to, for example, detect vibrations or deflection in the free/suspended portion of the III-N layer. Accordingly, MEMS sensors can be formed using the techniques, such as accelerometers, gyroscopes, and pressure sensors, for example. Numerous variations and configurations will be apparent in light of this disclosure.

General Overview

The potential of microelectromechanical systems (MEMS) devices is increased when the MEMS devices can be merged onto a silicon (Si) substrate along with integrated circuits (e.g., various microelectronics), such as in a system-on-chip (SoC) implementation. Further, there are particular benefits to using group III material-nitride (III-N) materials for the MEMS devices. For example, gallium nitride (GaN) is a high bandgap material (having a bandgap of 3.4 eV) that has a large elastic modulus, high piezoelectric and piezoresistive coefficients, and chemical inertness, making GaN attractive for MEMS device applications. However, present solutions for III-N MEMS devices cannot be integrated with Si complementary metal-oxide-semiconductor (CMOS) devices in a single system-on-chip (SoC) implementation.

Thus, and in accordance with one or more embodiments of the present disclosure, techniques are disclosed for forming III-N MEMS structures on a group IV substrate. Accordingly, the techniques enable III-N-based MEMS devices on a Si, SiGe, or Ge substrate. In an embodiment, the techniques include releasing the III-N MEMS structures from underlying substrate material and/or shallow trench isolation (STI) material to form suspended structures. The III-N base layer can be released using, for example, a wet (chemical) etch process that selectively etches the substrate and/or STI material. This can be achieved due to the etch selectivity between III-N materials (such as GaN) and the group IV substrate materials (such as Si), as well as the etch selectivity between III-N materials (such as GaN) and STI material (such as silicon dioxide). In other words, the wet etch process can be performed using etchants that remove the substrate and/or STI material but do not remove the III-N material (or remove the III-N at a substantially slower relative rate). In some embodiments, an isotropic wet etch process may be used to release the III-N MEMS layer, while in other embodiments, an anisotropic wet etch process may be used. The result of the selective etching process is that a portion of the III-N MEMS base layer is suspended above the substrate, which is referred to herein as the free portion or free end, while a portion of the layer is still on the substrate, which is referred to herein as the fixed portion or fixed end, thereby creating cantilevered structures where the free portion/end can move. In some cases, a single free portion may extend from a single fixed portion, while in other cases, multiple free portions may extend from a single fixed portion.

In some embodiments, the base III-N MEMS layer may be GaN, aluminum gallium nitride (AlGaN), aluminum indium nitride (AlInN), aluminum nitride (AlN), indium gallium nitride (InGaN), aluminum indium gallium nitride (AlInGaN), or any other suitable III-N material as will be apparent in light of the present disclosure. In some embodiments, the base III-N MEMS layer may have a thickness of approximately 0.5-2 microns, or any other suitable thickness, depending on the end use or target application. In some embodiments, the base III-N MEMS layer may have a free end that extends approximately 2-200 microns from the fixed portion of the layer, or some other suitable amount, depending on the end use or target application. In some embodiments, the material, thickness, and/or deposition process used for the base III-N MEMS layer may determine the distance that the base layer can extend from the fixed portion. For example, GaN may be able to achieve free portions that extend greater than 200 microns from the fixed portion, as it has a fast epitaxial growth rate and high stiffness/rigidity. In some example embodiments, the free end of the III-N MEMS base layer may be able to achieve a wide range of vibration frequencies up to tens or hundreds of kilohertz, for example.

As will be apparent in light of the present disclosure, the suspended structures include the III-N base layer upon which a piezoresistive element can be formed for various MEMS sensor applications (e.g., accelerometers, gyroscopes, pressure sensors, to name a few). The various piezoresistive elements described herein can be used to detect structural vibrations or deflection in the MEMS structure (e.g., as a result of strain in the structure), as will be apparent in light of the present disclosure. In some embodiments, the piezoresistive element may include a single layer on the base III-N layer. For example, the single layer may be a polarization layer of aluminum nitride (AlN), aluminum gallium nitride (AlGaN), indium aluminum nitride (InAlN), indium aluminum gallium nitride (InAlGaN), or any other suitable material, depending on the end use or target application. In such an example embodiment, the polarization layer may form a two-dimensional electron gas (2DEG) transducer architecture. In another example, the single piezoresistive element layer may be an n-type doped III-N layer, such as n-type doped GaN or indium gallium nitride (InGaN). In some embodiments, the piezoresistive element may include multiple layers on the base III-N layer. For example, a polarization layer may be formed, followed by any number of additional 2DEG layer sets, to form a multiple quantum-well (MQW) architecture. In another example, a graded III-N layer may be formed on the base III-N layer followed by a polarization layer, where the graded layer may be graded such that the resulting structure formed can be used for three-dimensional electron gas (3DEG) transducer architecture. In some embodiments, contacts may be formed on the piezoresistive element to form the MEMS sensor.

Upon analysis (e.g., using scanning/transmission electron microscopy (SEM/TEM), composition mapping, secondary ion mass spectrometry (SIMS), atom probe imaging, 3D ion tomography, etc.), a structure or device configured in accordance with one or more embodiments will effectively show the integrated circuit and MEMS structures variously described herein. For example, in some embodiments, III-N MEMS structures formed on a Si, SiGe, or Ge substrate and including suspended III-N sections may be detected. In other words, a gap (e.g., an air gap) can be detected between the suspended or free portions of the III-N MEMS structures and the substrate. In addition, the III-N MEMS structures may include piezoresistive elements as variously described herein, such as n-type doped III-N elements, polarization elements to form 2DEG, 3DEG architecture elements, MQW architecture elements, or any other piezoresistive element as will be apparent in light of the present disclosure. Because the III-N MEMS structures can be used for various sensor applications, the structures variously described herein may be found in accelerometers, gyroscopes, pressure sensors, or various other sensor devices. In some cases, the III-N MEMS structures may be found in a SoC implementation (e.g., a single chip or chip set), such as in the form of microsensors or microactuators, for example. The III-N MEMS structures variously described herein may be suitable for various applications, such as for mobile computing devices (e.g., smartphones, tablet computers, game/entertainment consoles, etc.), especially as they enable SoC integration with Si, SiGe, and Ge substrates, thereby enabling smaller form factor for such devices. Numerous configurations and variations will be apparent in light of this disclosure.

Architecture and Methodology

FIG. 1 illustrates a method 100 of forming an integrated circuit, in accordance with one or more embodiments of the present disclosure. FIGS. 2A-C, 3A-C, 4A-B, 5, 6A-C, and 7 illustrate example integrated circuit structures that are formed when carrying out method 100 of FIG. 1, in accordance with various embodiments. Note that FIGS. 2A-C, 3A-C, 4A-B, and 6A-C illustrate cross-sectional side views of various integrated circuit structures, while FIGS. 5 and 7 illustrate top elevation views of integrated circuit structures (in other words, views looking down on the integrated circuit structures). As will be apparent in light of the structures formed, method 100 discloses techniques for forming III-N MEMS structures on a Si, SiGe, or Ge substrate. Various MEMS devices can benefit from the techniques variously described herein, including, but not limited to, various MEMS sensors, such as accelerometers, gyroscopes, and pressures sensors, for example. In addition, the techniques enable SoC integration of III-N MEMS structures on Si, SiGe, and Ge substrates, which may be used to form other structures and devices, as will be described in more detail herein.

Figure 2A:
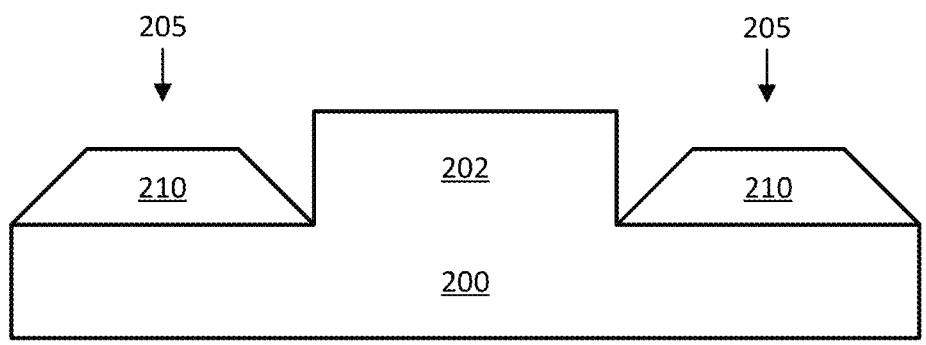
FIGS. 2A-C, 3A-C, 4A-B, 5, 6A-C, and 7 illustrate example structures that are formed when carrying out the method of FIG. 1, in accordance with various embodiments of the present disclosure. Note that FIGS. 2A-C, 3A-C, 4A-B, and 6A-C show cross-sectional side views of integrated circuit structures.
Figure 2B:
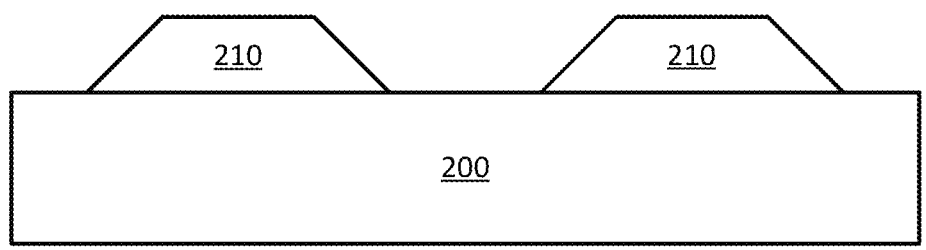
Figure 2C:
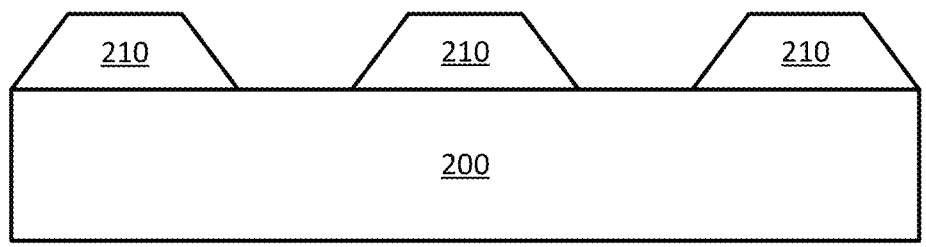

As can be seen in FIG. 1, method 100 includes optionally patterning 102 fins 202 in a substrate 200 and patterning 104 STI material 210 on the substrate 200 to form the example resulting structures shown in FIGS. 2A-C, in accordance with some embodiments. As can be seen in the structure of FIG. 2A, a single fin 202 was formed in substrate 200 prior to patterning 104 STI material 210 on the substrate. In the example structures of FIGS. 2B and 2C, fins were not patterned in substrate 200 prior to patterning the STI material 210. In some embodiments, substrate 200 may be a bulk substrate of Si, SiGe, or Ge. In some embodiments, substrate 200 may be an X on insulator (XOI) structure where X comprises Si, SiGe, or Ge, and the insulator material is an oxide material or dielectric material or some other electrically insulating material or some other suitable multilayer structure where the top layer comprises Si, SiGe, or Ge. For example, in some embodiments, the substrate may be a bulk Si substrate with a buffer layer of SiGe or Ge on top of a portion of the bulk Si substrate, where that buffer layer can be used for substrate 200 as variously described herein. The bulk Si substrate may be of high resistivity (e.g., greater than 10 ohm-cm), in some example applications. Fin 202 can be formed 102 from substrate 200 using any suitable techniques, such as using one or more patterning, masking, lithography, and etching (wet and/or dry) processes. As can also be seen in FIG. 2A, the structure includes trenches 205, which may be referred to as shallow trench recess (STR) trenches, in some instances. Trenches 205 may be formed with varying widths and depths, and the fin 202 may be formed to have varying widths and heights, depending on the end use or target application. The fin 202 may be formed to have varying widths and heights. Note that although a single fin 202 is shown in the example structure, any number of fins may be formed, such as two, five, ten, hundreds, thousands, millions, etc., depending on the end use or target application. Further note that substrate 200 may be patterned into a geometry having other shapes than fins, depending on the end use or target application.

Deposition 104 of STI material 210 may include any suitable techniques, such as chemical vapor deposition (CVD), atomic layer deposition (ALD), physical vapor deposition (PVD), or any other suitable deposition process. STI material 210 may comprise any suitable insulating material, such as one or more oxides (e.g. silicon dioxide) and/or nitrides (e.g., silicon nitride). In some embodiments, the STI material 210 may selected based on the substrate material 200. For example, in the case of a Si substrate 200, STI material 210 may be silicon dioxide or silicon nitride. Note that STI material 210 is shown formed as trapezoids in the example structures of FIGS. 2A-C; however, the present disclosure is not intended to be so limited.

Figure 3A:
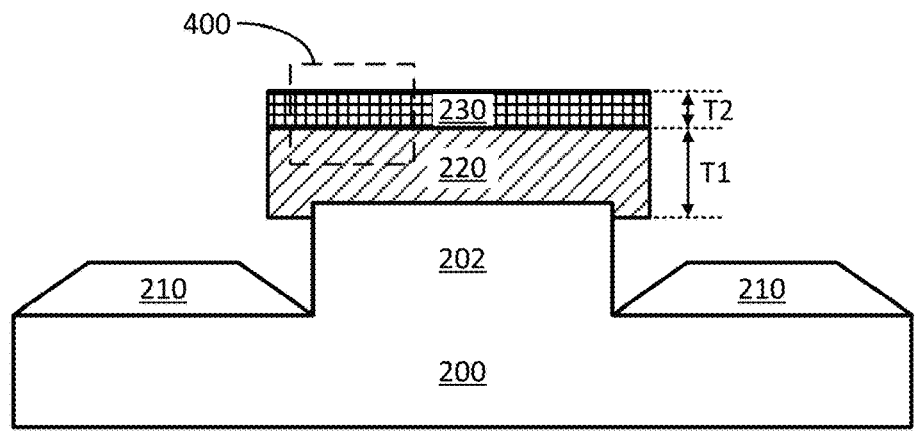
Figure 3B:
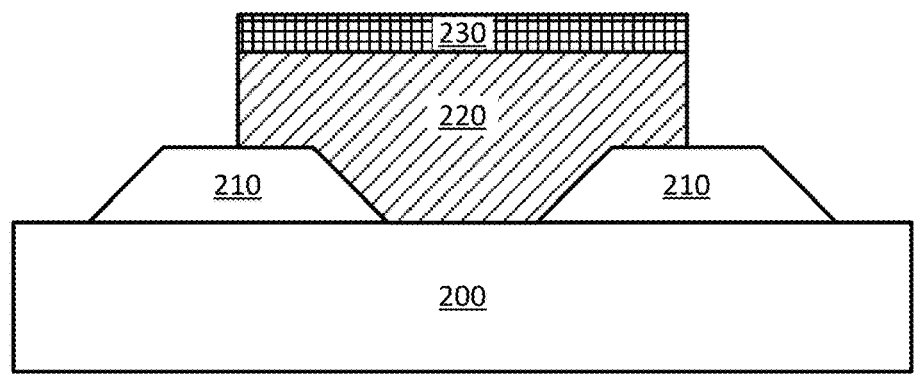
Figure 3C:
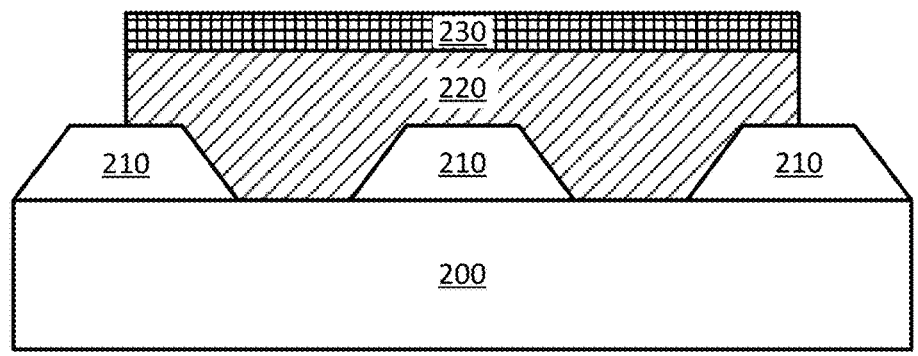

Method 100 of FIG. 1 continues with depositing 106 the III-N material layer 220 and depositing 108 the piezoresistive layer(s) 230 to form the resulting example structures shown in FIGS. 3A-C, in accordance with some embodiments. Depositions 106 and 108 may include any suitable techniques, such as growing the III-N layer 220 and the piezoresistive layer(s) 230 in a metal-organic chemical vapor deposition (MOCVD) chamber or any other suitable deposition process. In some embodiments, the growth conditions may be adjusted based on the desired resulting characteristics of the layers. For example, in some cases, the temperature may be increased and/or the pressure may be decreased and/or the VIII ratio (e.g., the ratio of N2 to Ga precursor gas flows) may be increased to cause the lateral or horizontal component of the layers 220 and 230 to grow faster, thereby maintaining the layers 220 and 230 as thin as possible in the vertical component of the layer. In some embodiments, the III-N layer 220 may be deposited 106 such that it only grows on the substrate material and not on the STI material 210, as is the case in FIGS. 3A-C. For example, as shown in FIG. 3B, the III-N material 220 has grown in between the STI structures 210 and partially spilled over onto those structures during the growth 106 process. The exposed sections of substrate 200 that do not include growth of III—N layer 220 may have been masked prior to performing deposition 106. In some embodiments, III-N layer 220 may be gallium nitride (GaN), aluminum gallium nitride (AlGaN), aluminum indium nitride (AlInN), aluminum nitride (AlN), indium gallium nitride (InGaN), aluminum indium gallium nitride (AlInGaN), or any other suitable material as will be apparent in light of the present disclosure. In some embodiments, the III-N layer 220 may have a thickness T1 of approximately 0.5-3 microns, or any other suitable thickness, depending on the end use or target application.

The piezoresistive layer(s) 230 can be patterned into piezoresistive elements, as described below, which can be used to detect structural vibrations or deflection in the structure (e.g., as a result of strain in the structure). In some embodiments, the piezoresistive layer 230 may be a single layer on the base III-N layer 220. In some such embodiments, the single piezoresistive layer 230 may be a polarization layer of aluminum nitride (AlN), aluminum gallium nitride (AlGaN), indium aluminum nitride (InAlN), indium aluminum gallium nitride (InAlGaN), or any other suitable material, depending on the end use or target application. In such an example embodiment, the polarization layer can be used to form a two-dimensional electron gas (2DEG) transducer architecture, for example. In such embodiments where the piezoresistive layer 230 is a polarization layer, the layer may have a thickness T2 of approximately 3 to 20 nm, or some other suitable thickness, depending on the end use or target application. In some embodiments where the piezoresistive layer 230 is a single layer, the layer may be an n-type doped III-N layer, such as n-type doped GaN or InGaN. For example, in some such embodiments, the material may be $In_xGa_{1-x}N$, with x ranging from 0 to 0.15 (or from 0 to 15%). Example n-type dopants for the III-N material include Si and oxygen, just to name a few examples, and such doping may be greater than 1E20 per cubic cm, or any other suitable amount, depending on the end use or target application. In some such embodiments where the piezoresistive layer 230 is a single layer of an n-type doped III-N material, the material may have a thickness T2 of approximately 20 to 200 nm, or some other suitable thickness, depending on the end use or target application.

In some embodiments, the piezoresistive layer(s) 230 may include multiple layers. For example, section 400 depicted in FIG. 3A is the same section in the embodiments shown in FIGS. 4A (section 400A) and 4B (section 400B), where the piezoresistive layer(s) 230 include multiple layers. In the example embodiment of FIG. 4A, the piezoresistive layers 230 shown in section 400A (which is an alternative structure to the section 400 of FIG. 3A) include a polarization layer 231 on the base III-N layer 220, along with two III-N/polarization layer sets 232/233 and 234/235. In other words, the structure shown in FIG. 4A may be a multiple quantum-well (MQW) structure, where three 2DEG pairings are present in the example structure (pairings 220/231, 232/233, and 234/235), for example. In this example embodiment, III-N layers 232 and 234 may include any of the materials mentioned with respect to base III-N layer 220 (e.g., GaN, AlGaN, AlInN, AlN, InGaN, AlInGaN, etc.). In this example embodiment, III-N layers 232 and 234 may have thicknesses T4 and T6 in the range of approximately 5 to 200 nm, or any other suitable thickness, depending on the end use or target application. In addition, polarization layers 231, 233, and 235 may include any of the materials previously mentioned above with respect to the single polarization layer (e.g., AlN, AlGaN, InAlN, InAlGaN, etc.). In this example embodiment, polarization layers 231, 233, and 235 may have thicknesses T3, T5, and T7 in the range of approximately 3 to 20 nm, or any other suitable thickness, depending on the end use or target application. In some embodiments, fewer or additional 2DEG layer sets may be present. For example, in the embodiment of FIG. 4A, there are three 2DEG sets, as previously described, however, there may be only 2 sets (e.g., if layers 234 and 235 were not present in the structure), 5 sets, 10 sets, 100 sets, or any number n of sets of the layers, depending on the end use or target application.

Figure 4A:
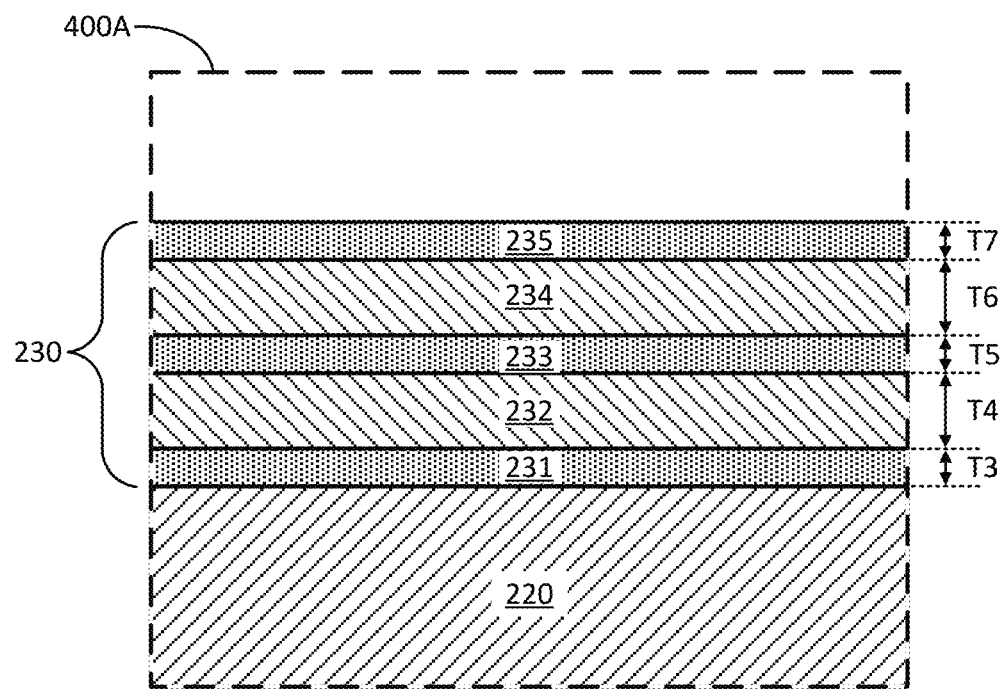
Figure 4B:
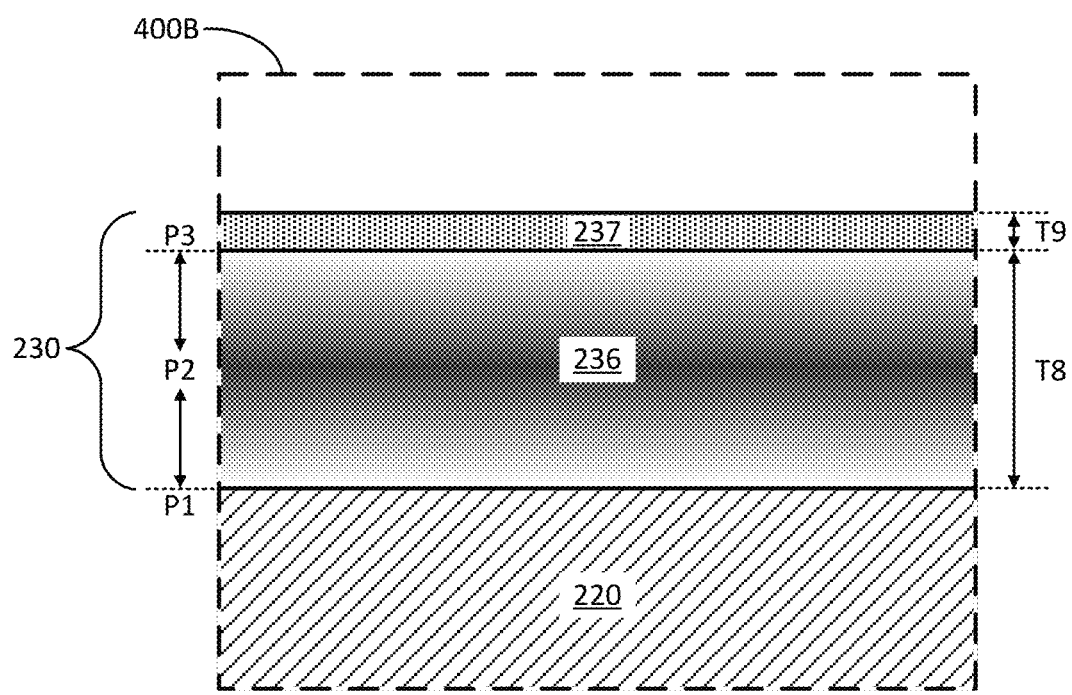
Figure 5:
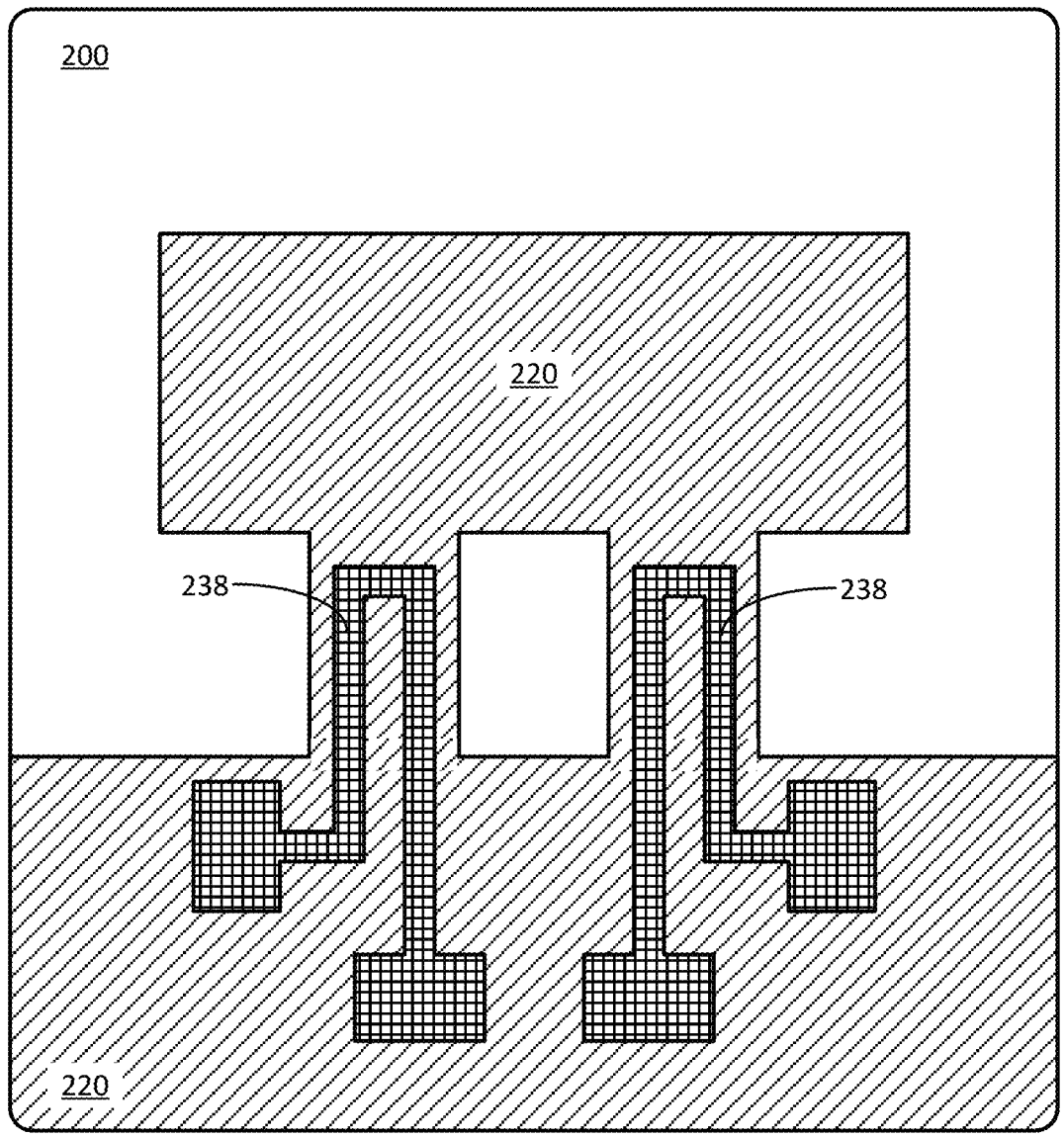

In the example embodiment of FIG. 4B, the piezoresistive layers 230 shown in section 400B (which is an alternative structure to section 400 of FIG. 3A) include a graded III-N layer 236 on the base III-N layer 220 and a polarization layer 237 on the graded III-N layer 236. In other words, the structure shown in FIG. 4B may be a 3DEG structure, for example. In this example embodiment, graded layer 236 may be indium gallium nitride ($In_xGa_{1-x}N$) and the content of indium in layer 236 may be graded from 0% (x=0), or some other suitable starting minimum indium content percentage, at the P1 starting location of growth indicated and increased to approximately 10% (x=0.1), or some other suitable maximum indium content percentage, at the P2 position, which is approximately the middle of layer 236. The indium content may also be decreased in a graded manner from the maximum indium content percentage position P2 back down to the minimum indium content percentage (e.g., 0% or x=0) at the P3 position. In this example embodiment, graded III-N layer 236 may have a thickness T8 in the range of approximately 15 to 20 nm, or any other suitable thickness, depending on the end use or target application. In addition, polarization layer 237 may include any of the materials previously mentioned above with respect to the single polarization layer (e.g., AlN, AlGaN, InAlN, InAlGaN, etc.). In some embodiments, such as where the graded III-N layer 236 is InGaN, the polarization layer 237 may be selected to be AlN. In this example embodiment, polarization layer 230 may have a thickness T9 of approximately 3 nm, or any other suitable thickness, depending on the end use or target application. Various other piezoresistive layers may be used to form various piezoresistive elements, such as n-type doped silicon or other suitable materials that would function as a piezoresistive element. Therefore, the examples provided herein are not intended to limit the present disclosure.

Method 100 of FIG. 1 continues with patterning 110 piezoresistive layer(s) 230 into piezoresistive element(s) 238 to form the resulting example structure shown in FIG. 5, in accordance with an embodiment. As previously described, FIGS. 2A-C, 3A-C, and 4A-B illustrate cross-sectional side views of an integrated circuit, whereas FIG. 5 illustrates a top elevation view of the integrated circuit. This view is provided in FIG. 5 to illustrate that the piezoresistive layer(s) 230 have been patterned into the piezoresistive elements 238 shown. Patterning 110 may include any suitable techniques, such as various masking, lithography and/or etching processes to form one or more desired piezoresistive elements based on, for example, the end use or target application. In some embodiments, the piezoresistive element(s) may be patterned 110 based on the MEMS device being formed. Note that in some embodiments, one or more piezoelectric element(s) may be formed in place of or instead of the piezoresistive element(s) variously described herein. In some such embodiments, the MEMS device being formed may dictate the element(s) used, for example.

Method 100 of FIG. 1 continues with masking 112 the piezoresistive element(s) 238 and etching 114 to remove the substrate 200 and/or STI 210 material below a portion of the III-N layer 220, to form the example resulting structures of FIG. 6A-C, in accordance with some embodiments. The result of the masking process 112 is not shown in FIGS. 6A-C, but masking 112 may be performed using any suitable techniques and any suitable hardmask materials, such as various oxide or nitride materials, for example, such as silicon oxide, titanium oxide, hafnium oxide, aluminum oxide, or titanium nitride, just to name a few specific examples. Note that in some embodiments, etching 114 may remove the hardmask deposited in process 112, while in other embodiments, etching 114 may include one or more additional processes to remove the hardmask on the piezoresistive element(s). Etching 114 may include either an isotropic or anisotropic wet (or chemical) etch that selectively removes the substrate 200, 202 and/or STI 210 material under a portion of the III-N layer 220, to cause a portion of the III-N layer 220 to be suspended in air above the substrate 200. Any suitable etch process(es) may be used, and etchants may be selected based on the materials of the substrate 200, STI 210, and/or III-N layer 220, depending on the desired configuration.

Figure 6A:
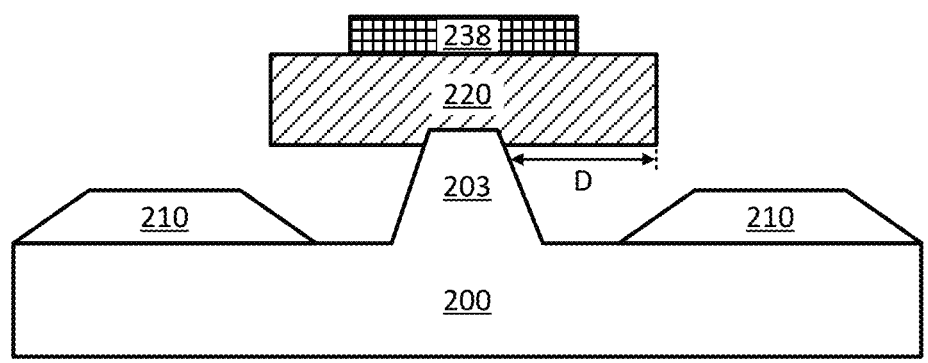
Figure 6B:
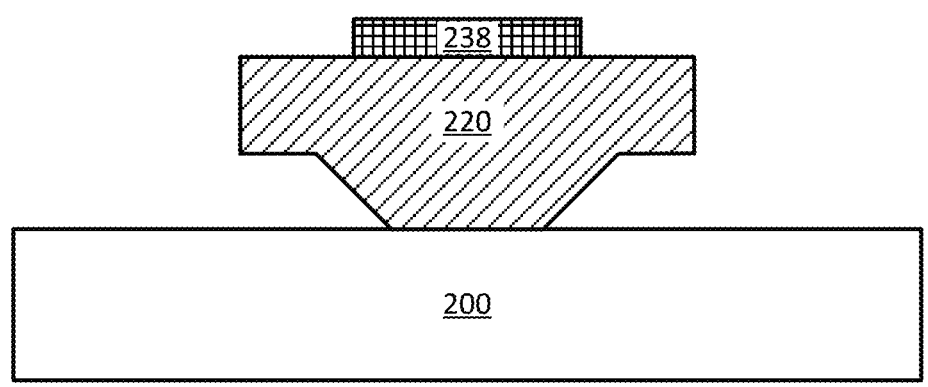
Figure 6C:
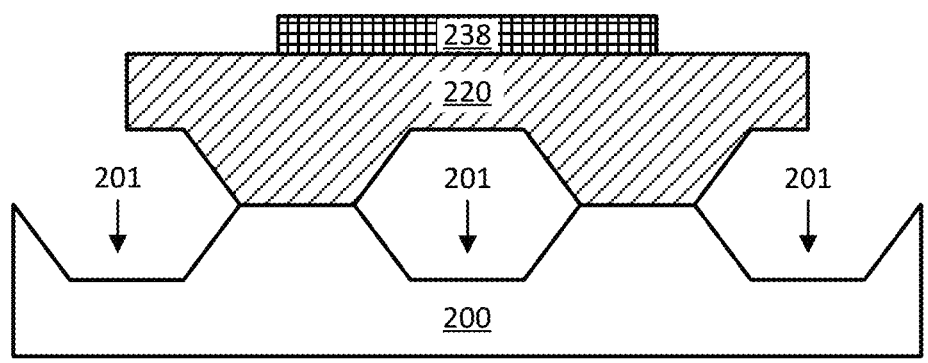
Figure 7:
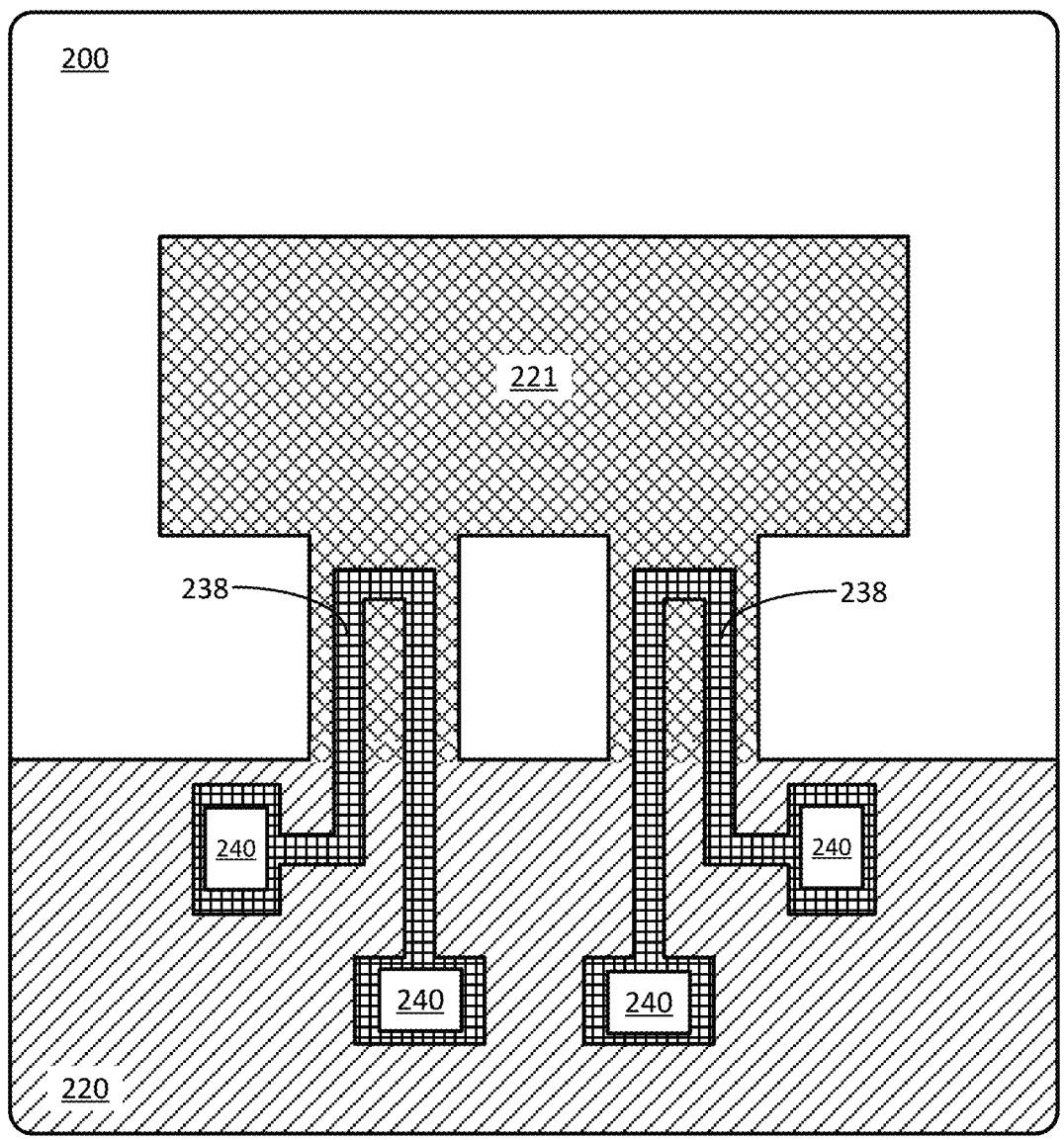

FIG. 6A shows an example structure corresponding to FIG. 3A, where substrate fin 202 was selectively etched to form the resulting smaller fin 203. Note that the etch process 114 used to form the structure of FIG. 6A removed only the substrate material 200, but did not remove (or removed at a substantially lower rate, such as 2×, 3×, 5×, 10×, etc. slower) the STI material 210, the III-N layer material 220, or the piezoresistive element material 238. Further note that the piezoresistive element material 238 may not have been removed during the etching process 114 as a result of the piezoresistive element(s) being masked. As can be seen in FIG. 6A, the etch 114 selective to the substrate material created a cantilevered structure where the III-N layer 220 and piezoresistive element 238 are suspended above a portion of the substrate 200, resulting in a fixed portion on substrate fin 203 and two free portions extending laterally from the fixed portion in the middle. As can also be seen, one free portion of III-N layer 230 released by wet etch 114 may extend and be suspended for a distance D, which may be approximately 2 to 200 microns, or any other suitable distance, depending on the end use or target application. Numerous structures and configurations are achievable by selectively etching underlying substrate material 200 and/or STI material 210 to release portions of III-N base layer 220 and create suspended/cantilevered structures. FIG. 6B shows another example structure corresponding to FIG. 3B, where the STI material 210 was selectively etched to form the resulting structure shown in FIG. 6B. Note that in this example case, the etch process 114 was selective to the STI material 210, such that it removed the STI material 210, but did not remove (or removed at a substantially lower rate, such as 2×, 3×, 5×, 10×, etc. slower) the substrate material 200, the III-N layer material 220, or the piezoresistive element material 238. Further note that the piezoresistive element material 238 may not have been removed during the etching process 114 as a result of the piezoresistive element(s) being masked. FIG. 6C shows another example structure corresponding to FIG. 3C, where the STI material 210 and the substrate material 220 were selectively etched to form the resulting structure shown in FIG. 6C. Note that in this example case, etch 114 may have included multiple etch processes, one of which was selective to the STI material 210 and one of which was selective to the substrate material 200 (thus forming trenches 201 in the substrate 200 of FIG. 6C). However, a single etchant selective to both the substrate and STI material may have been used, depending on the particular configuration and materials involved.

Method 100 of FIG. 1 continues with forming 116 contacts 240 on piezoresistive element(s) 238 to form the resulting example structure shown in FIG. 7, in accordance with an embodiment. As previously described, FIG. 7 illustrates a top elevation view of the example integrated circuit structure. Formation 116 of contacts 240 can be performed using any suitable techniques, such as various patterning, masking, and/or depositing processes, or any other suitable processes. Contacts 240 can be any suitable material, such as a metal or metal alloy, for example. Note that the structure in FIG. 7 is also provided to illustrate the free portion 221 of the III-N layer, after etch 114 was performed. As can be understood based on this disclosure, the fixed portion of the III-N layer 220 is formed on a portion of substrate 200, while the free portion 221 of the III-N layer (depicted by cross-hatching) is suspended over substrate 200 and thus an air gap exists between the substrate and the free portion 221. The piezoresistive element 238 extends onto the free portion 221 of the base III-N layer, allowing for the detection of vibrations or deflection of that free portion 221. Additional processes may be performed to complete the formation of a desired MEMS device, such as a sensor (e.g., accelerometer, gyroscope, pressure sensor, etc.) or suitable MEMS device, depending on the end use or target application.

Figure 8:
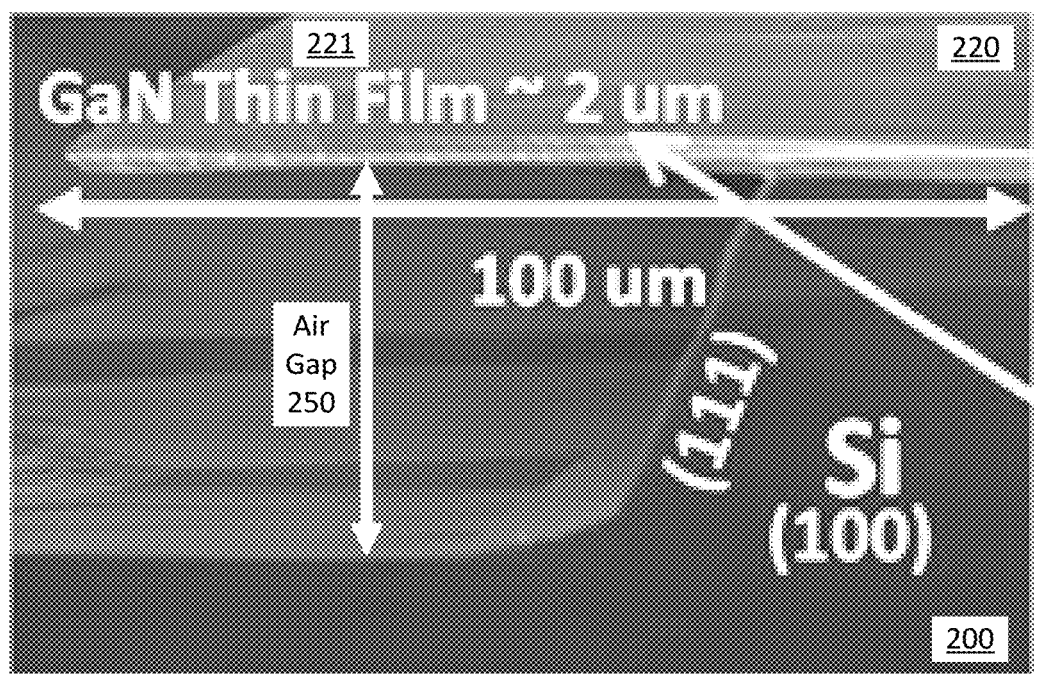
FIG. 8 is a transmission electron microscopy (TEM) image illustrating a cross-sectional side view of an integrated circuit structure formed in accordance with an embodiment of the present disclosure.

FIG. 8 is a transmission electron microscopy (TEM) image illustrating a cross-sectional side view of an integrated circuit structure formed in accordance with an embodiment of the present disclosure. As can be seen, the image illustrates a Si substrate 200 including a thin GaN film 220 on the substrate 200. As can also be seen, the GaN film layer 220 has a free portion 221 that is suspended over substrate 200, creating air gap 250 as shown. In this example embodiment, the free portion 221 of the GaN layer 220 extends approximately 100 microns from the fixed portion (the portion of the GaN layer still on substrate 200), although the free portion 221 may extend other suitable distances as well (e.g., 2 to 200 microns). In addition, in this example embodiment, the GaN layer 220/221 is shown as having a thickness of approximately 2 microns, although other suitable thicknesses can be used as well (e.g., 0.5 to 3 microns). The free portion 221 that is suspended over the substrate 200 can vibrate or deflect into air gap 250, and such vibration or deflection can be detected by a piezoresistive element on the GaN layer. Although layer 220/221 is illustrated as GaN in this example embodiment, the III-N thin film layer 220/221 may be AlGaN, AlInN, AlN, InGaN, or AlInGaN, or any other suitable III-N material, as will be apparent in light of this disclosure. Accordingly, the techniques enable SoC integration of III-N MEMS devices on a Si substrate (or SiGe substrate or Ge substrate), as variously described herein. Numerous variations and configurations will be apparent in light of this disclosure.

Example System-on-Chip (SoC) Implementation

Figure 9:
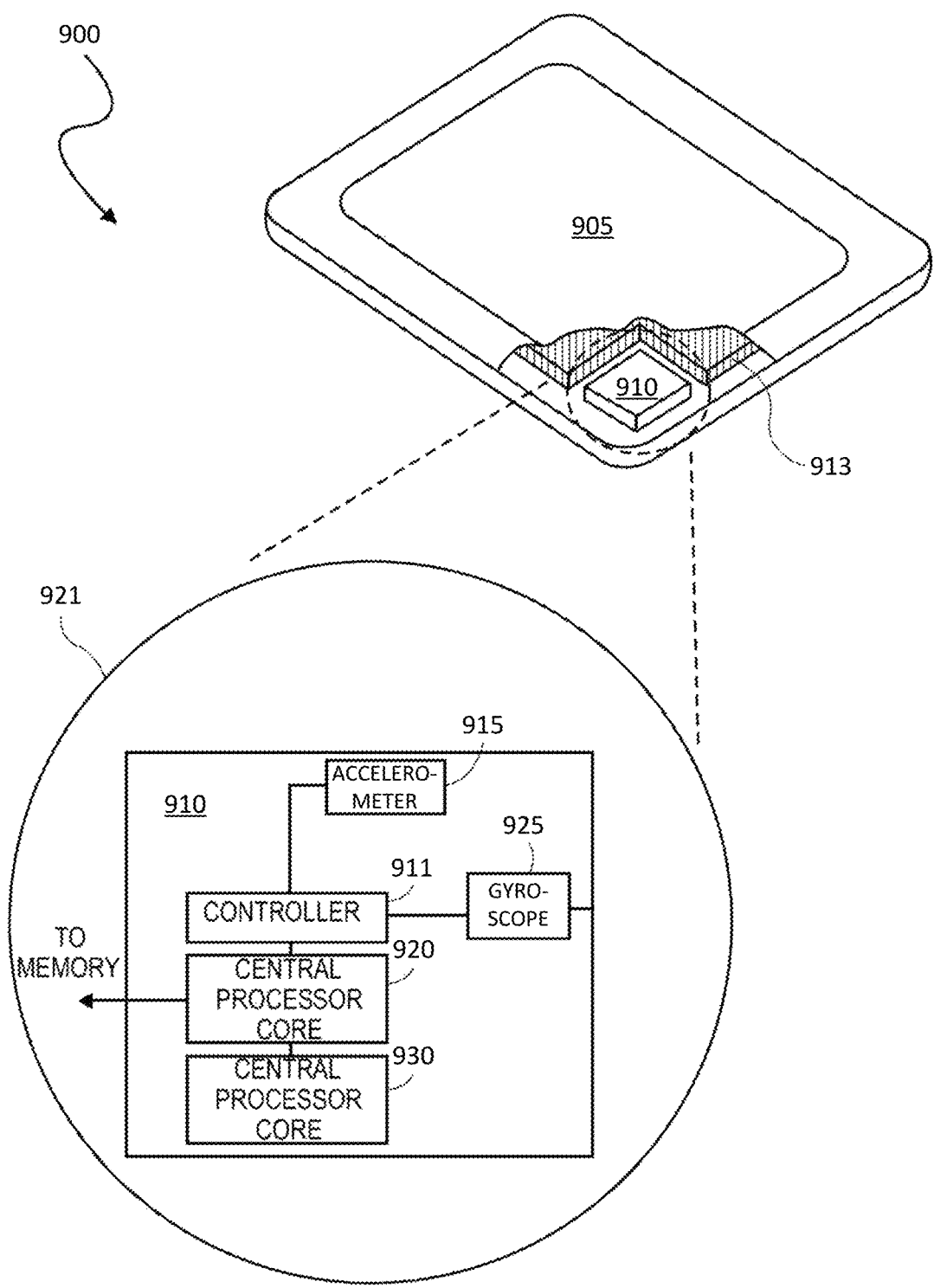
FIG. 9 illustrates a functional block diagram of a system-on-chip (SoC) implementation of a mobile computing platform, in accordance with various embodiments of the present disclosure.

FIG. 9 illustrates a functional block diagram of a SoC implementation of a mobile computing platform, in accordance with various embodiments of the present disclosure. The mobile computing platform 900 may be any portable device configured for each of electronic data display, electronic data processing, and wireless electronic data transmission. For example, mobile computing platform 900 may be any of a tablet, a smart phone, laptop computer, etc. and includes a display screen 905 that is in the exemplary embodiment a touchscreen (e.g., capacitive, inductive, resistive, etc.) permitting the receipt of user input, the SoC 910, and a battery 913. As illustrated, the greater the level of integration of the SoC 910, the more of the form factor within the mobile computing platform 900 that may be occupied by the battery 913 for longest operative lifetimes between charging, or occupied by memory (not depicted), such as a solid state drive, for greatest functionality.

Depending on its applications, mobile computing platform 900 may include other components including, but not limited to, volatile memory (e.g., DRAM), non-volatile memory (e.g., ROM), flash memory, a graphics processor, a digital signal processor, a crypto processor, a power management integrated circuit (PMIC), an RF integrated circuit (RFIC) (which may include an RF transmitter and/or receiver, chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). The RFIC may implement any of a number of wireless standards or protocols, including but not limited to Wi-Fi (IEEE 902.11 family), WiMAX (IEEE 902.16 family), IEEE 902.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The SoC 910 is further illustrated in the expanded view 921. Depending on the embodiment, the SoC 910 may include a portion of a substrate (a chip) upon which two or more of the following are included: one or more accelerometers 915; one or more gyroscopic sensors or gyroscopes 925; a controller thereof 911; and one or more central processor cores 920, 930. As can be understood based on the present disclosure, the techniques and MEMS structures variously described herein can be used to provide sensor functionality, such as for the accelerometer(s) 915 and gyroscope(s) 925 on chip 910. Further, the etch to release techniques variously described herein allow MEMS structures to be formed on Si, SiGe, and Ge substrates, enabling smaller form factor and various SoC implementations (such as with Si CMOS devices, for example).

Example System

Figure 10:
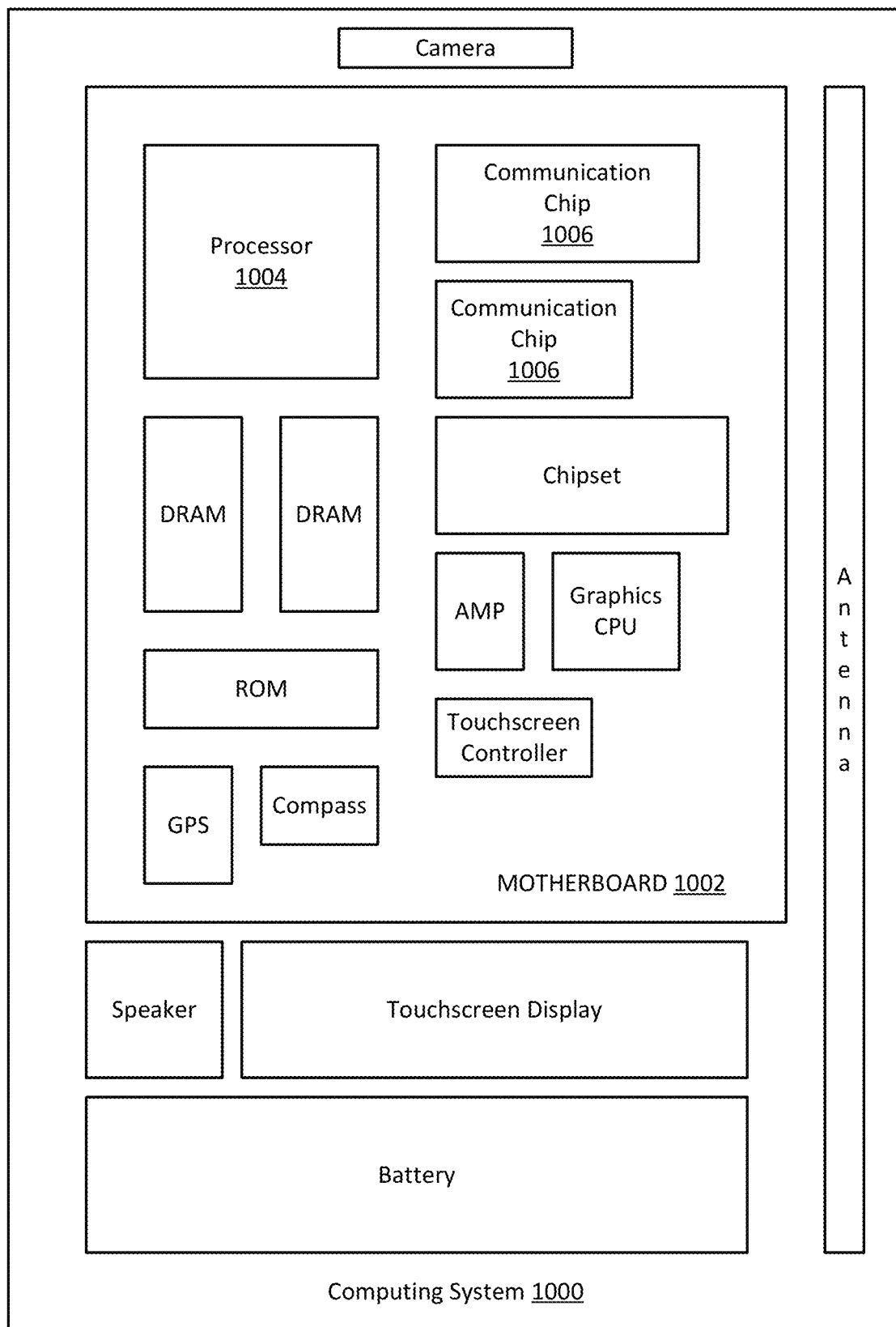
FIG. 10 illustrates a computing system implemented with integrated circuit structures or devices formed using the techniques disclosed herein, in accordance with various embodiments of the present disclosure.

FIG. 10 illustrates a computing system 1000 implemented with integrated circuit structures or devices formed using the techniques disclosed herein, in accordance with various embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. For example, the computing system 1000 may include any number of sensors, such as various accelerometers, gyroscopes, pressure sensors, etc., and such sensors may include one or more of the integrated circuit structures or devices (e.g., MEMS structure or devices) variously described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a substrate; a group III material-nitride (III-N) layer including a fixed portion on the substrate and a free portion suspended above the substrate; and a piezoresistive element on the III-N layer.

Example 2 includes the subject matter of Example 1, wherein the substrate is one of silicon, silicon germanium, and germanium.

Example 3 includes the subject matter of any of Examples 1-2, wherein the III-N layer is gallium nitride.

Example 4 includes the subject matter of any of Examples 1-2, wherein the III-N layer is one of aluminum gallium nitride, aluminum indium nitride, aluminum nitride, indium gallium nitride, and aluminum indium gallium nitride.

Example 5 includes the subject matter of any of Examples 1-4, wherein the III-N layer has a thickness of approximately 0.5 to 2 microns.

Example 6 includes the subject matter of any of Examples 1-5, wherein the free portion of the III-N layer extends approximately 2 to 100 microns from the fixed portion.

Example 7 includes the subject matter of any of Examples 1-6, wherein the piezoresistive element is a single layer of one of aluminum nitride, aluminum gallium nitride, indium aluminum nitride, and indium aluminum gallium nitride.

Example 8 includes the subject matter of any of Examples 1-6, wherein the piezoresistive element is a single layer of one of n-type doped gallium nitride and n-type doped indium gallium nitride.

Example 9 includes the subject matter of any of Examples 1-6, wherein the piezoresistive element includes a polarization layer on the III-N layer and at least one additional III-N layer and polarization layer to form a multiple quantum-well (MQW) architecture.

Example 10 includes the subject matter of any of Examples 1-6, wherein the piezoresistive element includes a gallium nitride layer graded with indium and a polarization layer to form a three-dimensional electron gas (3DEG) architecture.

Example 11 includes the subject matter of any of Examples 1-10, further including metal contacts on the piezoresistive element.

Example 12 includes the subject matter of any of Examples 1-11, wherein the substrate includes at least one of a controller and a processor in a system-on-chip (SoC) implementation.

Example 13 is a microelectromechanical systems (MEMS) sensor including the subject matter of any of Examples 1-12.

Example 14 is a computing system including the subject matter of any of Examples 1-13.

Example 15 is a microelectromechanical systems (MEMS) device including: a group III material-nitride (III-N) layer including a fixed portion on a substrate and a free portion suspended above the substrate; and a piezoresistive element on the III-N layer.

Example 16 includes the subject matter of Example 15, wherein the substrate is one of silicon, silicon germanium, and germanium.

Example 17 includes the subject matter of any of Examples 15-16, wherein the III-N layer is gallium nitride.

Example 18 includes the subject matter of any of Examples 15-16, wherein the III-N layer is one of aluminum gallium nitride, aluminum indium nitride, aluminum nitride, indium gallium nitride, and aluminum indium gallium nitride.

Example 19 includes the subject matter of any of Examples 15-18, wherein the III-N layer has a thickness of approximately 0.5 to 2 microns.

Example 20 includes the subject matter of any of Examples 15-19, wherein the free portion of the III-N layer extends approximately 2 to 100 microns from the fixed portion.

Example 21 includes the subject matter of any of Examples 15-20, wherein the piezoresistive element is a single layer of one of aluminum nitride, aluminum gallium nitride, indium aluminum nitride, and indium aluminum gallium nitride.

Example 22 includes the subject matter of any of Examples 15-20, wherein the piezoresistive element is a single layer of one of n-type doped gallium nitride and n-type doped indium gallium nitride.

Example 23 includes the subject matter of any of Examples 15-20, wherein the piezoresistive element includes a polarization layer on the III-N layer and at least one additional III-N layer and polarization layer to form a multiple quantum-well (MQW) architecture.

Example 24 includes the subject matter of any of Examples 15-20, wherein the piezoresistive element includes a gallium nitride layer graded with indium and a polarization layer to form a three-dimensional electron gas (3DEG) architecture.

Example 25 includes the subject matter of any of Examples 15-24, further including metal contacts on the piezoresistive element.

Example 26 includes the subject matter of any of Examples 15-25, wherein the substrate includes at least one of a controller and a processor in a system-on-chip (SoC) implementation.

Example 27 includes the subject matter of any of Examples 15-26, wherein the MEMS device is a MEMS sensor.

Example 28 is a computing system including the subject matter of any of Examples 15-27.

Example 29 is a method of forming an integrated circuit, the method including: depositing a group III material-nitride (III-N) layer on a substrate; forming at least one piezoresistive element on the III-N layer; and etching underlying material located below at least a portion of the III-N layer to release a portion of the III-N layer such that the portion of the III-N layer is suspended above the substrate, wherein the underlying material is at least one of the substrate and shallow trench isolation (STI) material on the substrate.

Example 30 includes the subject matter of Example 29, further including patterning one or more fins in the substrate prior to depositing the III-N layer.

Example 31 includes the subject matter of any of Examples 29-30, further including patterning the STI material on the substrate prior to depositing the III-N layer.

Example 32 includes the subject matter of any of Examples 29-31, further including masking the at least one piezoresistive element prior to etching the underlying material.

Example 33 includes the subject matter of any of Examples 29-32, further including forming contacts on the at least one piezoresistive element.

Example 34 includes the subject matter of any of Examples 29-33, wherein the substrate is one of silicon, silicon germanium, and germanium.

Example 35 includes the subject matter of any of Examples 29-34, further including forming a microelectromechanical systems (MEMS) sensor.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
a bulk silicon substrate;
a first layer including a fixed portion and a free portion, the fixed portion directly on the bulk silicon substrate and the free portion suspended above the bulk silicon substrate, wherein the first layer includes nitrogen and gallium; and
a piezoresistive element on the first layer, wherein the piezoresistive element includes a second layer including nitrogen, gallium, and indium, wherein the second layer has a bottom surface adjacent the first layer, a top surface, and a midportion between the top and bottom surfaces, wherein the indium concentration is greater in the midportion than it is at the top and bottom surfaces.

2. The integrated circuit of claim 1, wherein the first layer essentially consists of gallium and nitrogen.

3. The integrated circuit of claim 1, wherein the first layer includes one or both of aluminum or indium.

4. The integrated circuit of claim 1, wherein the first layer has a thickness of approximately 0.5 to 2 microns.

5. The integrated circuit of claim 1, wherein the free portion of the first layer extends approximately 2 to 100 microns from the fixed portion.

6. The integrated circuit of claim 1, wherein the piezoresistive element is a single layer.

7. The integrated circuit of claim 1, wherein the piezoresistive element includes a polarization layer on the first layer and at least one additional set of the first layer and the polarization layer to form a multiple quantum-well (MQW) architecture.

8. The integrated circuit of claim 1, further comprising metal contacts on the piezoresistive element.

9. A system-on-chip (SoC) comprising the integrated circuit of claim 1, and a controller or a processor.

10. A microelectromechanical systems (MEMS) sensor comprising the integrated circuit of claim 1.

11. A computing system comprising the integrated circuit of claim 1.

12. A microelectromechanical systems (MEMS) device comprising:
a first layer including a fixed portion and a free portion, the fixed portion directly on a bulk silicon substrate and the free portion suspended above the bulk silicon substrate, wherein the first layer includes nitrogen and gallium; and
a piezoresistive element on the first layer, wherein the piezoresistive element includes a second layer including nitrogen, gallium, and indium, wherein the second layer has a bottom surface adjacent the first layer, a top surface, and a midportion between the top and bottom surfaces, wherein the indium concentration is greater in the midportion than it is at the top and bottom surfaces.

13. The MEMS device of claim 12, wherein the first layer is one of gallium nitride, aluminum gallium nitride, indium gallium nitride, or aluminum indium gallium nitride.

14. The MEMS device of claim 12, wherein the MEMS device is a MEMS sensor.

15. An integrated circuit comprising:
a bulk silicon substrate;
a first layer including a first portion directly on the bulk silicon substrate and a second portion above the bulk silicon substrate, an air gap between the second portion of the first layer and the bulk silicon substrate, wherein the first layer includes nitrogen and gallium; and
one or more additional layers on the first layer, wherein the one or more additional layers include a second layer comprising nitrogen, gallium, and indium, wherein the second layer has a bottom surface adjacent the first layer, a top surface, and a midportion between the top and bottom surfaces, wherein the indium concentration is greater in the midportion than it is at the top and bottom surfaces.

16. The integrated circuit of claim 1, wherein the fixed portion of the first layer is directly on a fin of the bulk silicon substrate.

17. The integrated circuit of claim 1, further comprising a shallow trench isolation (STI) structure directly on the bulk silicon, wherein the first layer includes an angled sidewall that is laterally adjacent to an angled sidewall of the shallow trench isolation structure, and the first layer extends above a top surface of the STI structure.

18. The integrated circuit of claim 1, wherein the substrate and the first layer each includes an angled sidewall that is laterally adjacent to a same airgap.

19. The integrated circuit of claim 1, wherein the piezoresistive element has a different top elevation view profile than the first layer.

20. The integrated circuit of claim 15, wherein the first portion of the first layer is directly on a fin of the bulk silicon substrate.

* * * * *